(12) United States Patent
Kurnia et al.

(10) Patent No.: US 6,738,718 B2
(45) Date of Patent: May 18, 2004

(54) METHOD AND APPARATUS FOR MEASURING TORQUE AND FLUX CURRENT IN A SYNCHRONOUS MOTOR

(75) Inventors: Alexander Kurnia, Buffalo Grove, IL (US); Ronan De Larminat, Northbrook, IL (US)

(73) Assignee: Motorola, Inc., Schaumburg, IL (US)

( * ) Notice: Subject to any disclaimer, the term of this patent is extended or adjusted under 35 U.S.C. 154(b) by 136 days.

(21) Appl. No.: 10/108,092

(22) Filed: Mar. 27, 2002

(65) Prior Publication Data

US 2003/0184170 A1 Oct. 2, 2003

(51) Int. Cl.[7] .............................................. G01L 3/00
(52) U.S. Cl. ................................................. 702/41
(58) Field of Search .......................... 702/38, 41, 44, 702/57, 64, 65; 324/107, 140 R, 154 R; 310/40 R, 68 R; 318/799, 801, 803

(56) References Cited

U.S. PATENT DOCUMENTS 4,840,073 A * 6/1989 Aoki et al. ............ 73/862.334
6,591,200 B1 * 7/2003 Cohen et al. ................. 702/38

FOREIGN PATENT DOCUMENTS

| JP | 54-149818 | * 11/1979 |
| JP | 10-271899 | * 10/1998 |

* cited by examiner

*Primary Examiner*—Michael Nghiem
(74) *Attorney, Agent, or Firm*—S. Kevin Pickens

(57) ABSTRACT

An apparatus (100) for measuring torque and flux current in an AC synchronous drive motor (108), having a shaft (110) magnetically coupled to an a-phase stator, a b-phase stator and a c-phase stator, includes a shaft position indicator (112) that is coupled to the shaft (110) and that generates a position signal indicative of a position of the shaft (110). A current sensing circuit (114) generates a current signal indicative of instantaneous direct link current of the motor (108). A sample and hold amplifier (116) samples the current signal when a trigger input is asserted. A processor (120) asserts the trigger input from trigger generation (124). The processor (120) calculates torque generated by the motor (108) and flux current in the motor (108) based on the current signal value and decoding algorithm (122).

9 Claims, 2 Drawing Sheets

METHOD AND APPARATUS FOR MEASURING TORQUE AND FLUX CURRENT IN A SYNCHRONOUS MOTOR

BACKGROUND OF THE INVENTION

1. Field of the Invention

The present invention relates to electrical motor control systems and, more specifically, to a circuit that measures torque and flux current in a synchronous motor.

2. Description of the Prior Art

Electric motor drive applications are increasingly used in automotive applications. Recent trends include the use of electric motors in power steering. Since the battery voltage standard is only 12v, the peak motor power is limited to a low horsepower rating, typically on the order of a 1–2 HP motor. In high performance motion control, such as electric power steering, low torque ripple, low cost, small size and high reliability are required. These factors typically lead to the use of a permanent magnet synchronous motor (PMSM) instead of DC motor, a switch reluctance motor or an induction motor. The magnetic field and magneto-motive forces (MMF) in the PMSM are assumed to be sinusoidally distributed in space in order to minimize torque ripple.

In a PMSM drive, motor torque feedback is required to have a precise torque control. A vector control is typically used to achieve a high performance motor drive system. Speed sensor feedback is required and is easily obtained, for example, through a motor shaft encoder at relatively low cost. However, to control motor torque precisely, an absolute rotor position sensor is also required, which is obtained from sensing a motor back electro-motive force (EMF) or from a resolver. A motor torque feedback signal can be obtained from a torque sensor, but including a torque sensor may be a costly solution. A more commonly used method is to sense the motor currents and then derive the motor torque feedback from the sensed currents. However, existing methods of sensing motor currents are difficult, can be costly and can reduce performance.

PMSM Vector Control Background

The steady state electromagnetic torque ($T_e$) of PMSM, expressed in the dq model, is:

$$T_e = \frac{3}{2}\frac{P}{2}\frac{1}{\omega_e}[E_I I_{qd} + (X_{dx} - X_{qs})I_{ds}I_{qs}]$$

Since there is no damper winding in PMSM, the torque equation is also valid for the instantaneous case.

In an air gap magnet motor, where $X_{ds} \approx X_{qs}$, the torque expression is reduced to:

$$T_e \approx \frac{3}{2}\frac{P}{2}\frac{1}{\omega_e}E_I I_{qs}$$

The internal back EMF peak voltage $E_I$ (volt) is given as:

$$E_I = K_v \omega_e$$

And the quadrature axis (q-axis) motor current $I_{qs}$ (amp) is:

$$I_{qs} = I_{qds} \cos \gamma$$

Hence, the torque can also be expressed as:

$$T_e \approx K_T I_{qds} \cos \gamma$$

Where,

P=Number of poles.

$\omega_e$=Electrical synchronous motor speed which is also the stator frequency in rad/sec.

$X_{ds}$=Direct axis reactance encountered by the d-axis and q-axis current components in Henry-rad/sec.

$X_{qs}$=Quadrature axis reactance encountered by the d-axis and q-axis current components in Henry-rad/sec.

$X_s = X_{ds}$=Stator referred synchronous reactance in Henry-rad/sec.

$$r_s = \frac{\text{Short Circuit Load Loss}}{(\text{Short Circuit Armature Current})^2} = \text{effective stator } res.$$

$K_v$=EMF constant in V/(rad/sec.).

$K_T$=Torque constant in Nm/Amp.

$I_{qds}$=Amplitude motor stator peak current in Amp, hence it is a dc quantity.

$V_{qds}$=Amplitude motor stator peak phase voltage in volt, hence it is a dc quantity.

$\gamma$=A space angle measured at the vector position of the current $I_{qds}$ with respect to the q-axis (where $E_I$ is located). Cos ($\gamma$) is defined as internal power factor. Angle $\gamma$ is positive if the current vector $I_{qds}$ leads the voltage vector $E_I$. It is also referred as torque angle.

$\delta$=A space angle measured at the vector position of the $V_{qds}$ with respect to the q-axis (where $E_I$ is located). It is sometime called as "phase advance". Angle $\delta$ is positive if the voltage vector $V_{qds}$ leads the voltage vector $E_I$.

$\phi$=A space angle measured at the vector position of the $I_{qds}$ with respect to the Vector position of the current $V_{qds}$. Cos ($\phi$) is defined as load power factor. Angle $\phi$ is positive if the current vector $I_{qds}$ leads the voltage vector $V_{qds}$.

FIG. 1 shows a typical space vector representation 10 of 3-phase PMSM operation. Positive values for angles $\gamma$, $\delta$ or $\phi$ mean the angle is oriented counter clockwise with respect to the corresponding reference q & d axis. $I_{qds}$, $V_{qds}$, $E_i$ vectors along with the corresponding reference q & d axis, are simultaneously moving in a counter clockwise direction when the speed is positive. This means that the vectors rotate one 360° turn when the motor rotates one electrical turn. In the time domain expression, the phase sequence is A-B-C which corresponds to positive speed rotation. In a positive speed motoring operation, a PMSM typically operates where current vector $I_{qds}$ is in the first quadrant, i.e., $\gamma=0$ up to base speed operation and 0°<$\gamma$<90 beyond base speed operation.

To summarize, the two requirements for vector control in PMSM are measurement of rotor position (absolute rotor position is required) and precise control of the stator current to correctly position the resultant stator MMF in relation to the rotor position. Therefore, it is important to control the magnitude $I_{qds}$ and the angle $\gamma$ independently. The torque response will follow the stator current $I_{qds}$ instantaneously so long as the angle $\gamma=0°$. If the angle $\gamma$ attains a value other than zero, there will be a component of the stator current in the field axis (d-axis) and a flux change will take place. Since the flux change is not instantaneous, the torque response will also not be instantaneous if angle $\gamma$ or $I_{qds}$ is changed.

One way to control amplitude and phase of stator current independently is to use a current regulated PWM inverter (CRPWM) in a stationary reference frame. The CRPWM provides a conceptually simple means for implementing torque control with independent q-axis and d-axis current inputs ($I_{qs}$ and $I_{ds}$). In essence, all that is required is to use absolute rotor position information to convert the $I_{qs}^*$ and $I_{ds}^*$ commands in the rotor reference frame to a stator reference. The stator referred currents, at stator frequency, become the current commands for CRPWM. However, this technique requires instant stator current feedback information obtained through current sensors. In addition, the bandwidth of this regulator must be relatively high including dc in case of a stall mode condition.

Another method to measure q-axis and d-axis current inputs ($I_{qs}$ and $I_{ds}$) independently is by using a current regulator in rotor reference frame, i.e., a synchronous reference frame, since the rotor frequency is the same as the stator frequency. In this method, the $I_{qs}^*$ and $I_{ds}^*$ commands are dc quantities. Such regulators typically do not require a relatively high bandwidth. $I_{qs}$ and $I_{ds}$ feedback are required and in steady state they are dc quantities. $I_{qs}$ and $I_{ds}$ feedback are typically derived from stator phase currents feedback, $i_{as}$, $i_{bs}$, $i_{cs}$, using Park's transformation.

Current Sensing Techniques

In small horsepower drives, current sensors such as Hall Effect devices or current shunts are often placed in series with motor phases. In a three-phase system, two of such sensors are required. Such devices introduce a significant cost relative to the system cost. A lower cost method is to use a current shunt placed in the dc link.

In a closed-loop current mode motor control, one method is to sample dc link current $i_{dclink}$ and, knowing the corresponding PWM inverter switching state, to decode the stator phase currents, $i_{as}$, $i_{bs}$, $i_{cs}$. With the rotor position information, the instantaneous motor torque current $I_{qs}$ and motor flux current $I_{ds}$ can be derived from the stator phase currents. However, this method requires a significant amount of processing and sampling $i_{dclink}$ at a high sample rate, typically at the PWM switching frequency, at about 20 kHz. Therefore, a simple micro controller (MCU) implementation is impossible with this method. A high performance MCU or digital signal processor (DSP) with fast analog-to-digital (A/D) converters is required to accomplish the task.

A closed-loop current mode motor control, such as previously described, requires motor torque and flux currents obtained at high sample rate. In applications where motor torque and flux current feedback are only used for safety check diagnostic, computation integrity check, or feed forward control algorithm, $I_{qs}$ & $I_{ds}$ are not required to be acquired at high sample rate. Therefore, there is a need for a simpler method for cost effective implementation.

In a three-phase system, in one electrical cycle, there are six positions where the back EMF occurs at the maximum or minimum value. If the motor stator currents are acquired at the instant where the back EMF is at peak (maximum or minimum), theoretically the torque current $I_{qs}$ can also be obtained. In one electrical cycle, in theory six torque current $I_{qs}$ measurements can be obtained. If the motor stator currents are acquired at the instant where the back EMF is at 90° beyond its peak, in theory six flux current $I_{ds}$ measurements can also be obtained in one electrical cycle. Six $I_{qs}$ and 6 $I_{ds}$ feedback measurements are sufficient in applications where motor torque and flux currents feedback are used only for a safety check diagnostic, a computation integrity check, or a feed forward control algorithm.

One existing method uses the peak detect method. Motor torque current $I_{qs}$ is obtained by sampling the peak value of dc link current $i_{dclink}$ at the instant where the internal back EMF $E_I$ is at the peak (maximum or minimum). However the $I_{qs}$ measurement is only accurate for a limited range of torque angle γ, −30°<γ<30°, and phase advance angle δ, −60°<δ<60°.

Unfortunately, torque angle γ needs to be increased above the 30° limit when rotor speed goes up. In PMSM, maximum rotor speed is obtained when γ approaches 90°. The requirement on phase advance angle δ is not a big constraint because it can be kept under 60° in machine design.

In addition, the peak detect method will pose accuracy issues if there is an overshoot current in dc link current $i_{dclink}$ due to diode reverse recovery current Another disadvantage of this sampling technique is that it is not capable of measuring the d-axis current $I_{ds}$ directly. $I_{ds}$ can only be obtained by calculation from measured $I_{qs}$ and command angle γ. Therefore, $I_{qs}$ will not be measured accurately.

Therefore, there is a need for a cost effective method that measures torque and flux current accurately on a wider range of γ angle without dc link current high sample rate requirement.

DETAILED DESCRIPTION OF THE INVENTION

A preferred embodiment of the invention is now described in detail. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 2:
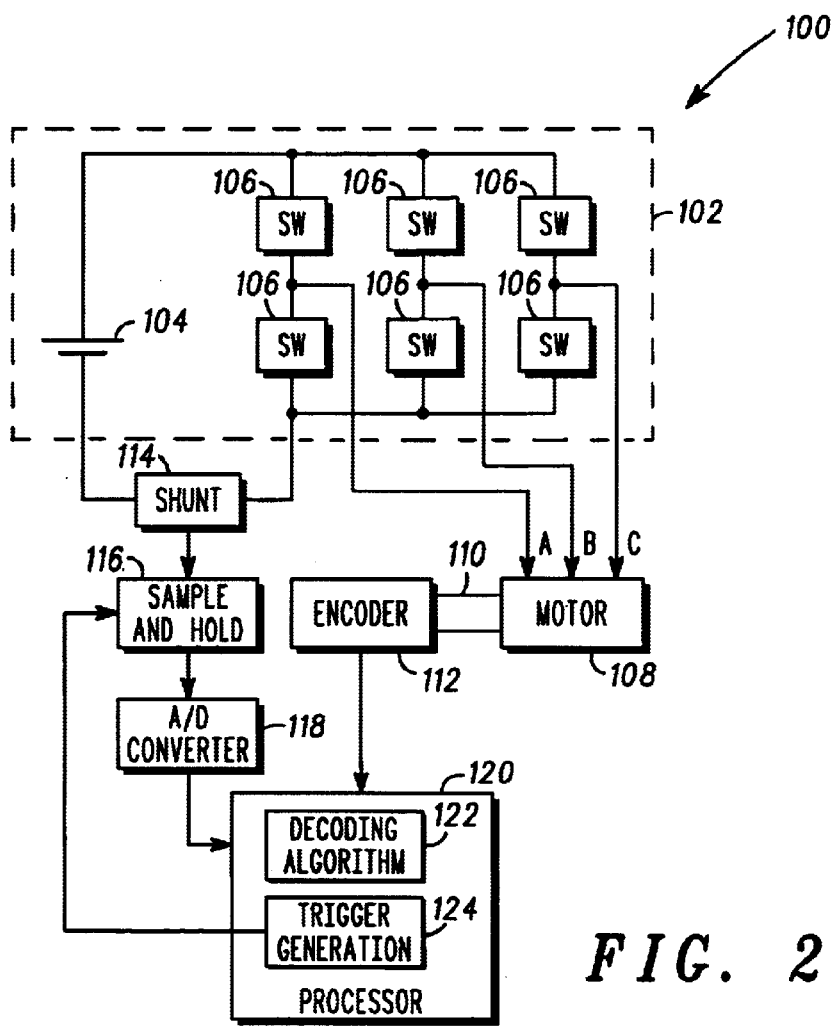
FIG. 2 is a block diagram of one illustrative embodiment of the invention.

As shown in FIG. 2, in one embodiment, the invention is an apparatus 100 for measuring torque and flux current in an AC synchronous drive motor 108. The drive motor 108 has a shaft 110 that is magnetically coupled to three stator windings: an a-phase, a b-phase and a c-phase. A power supply circuit 102, that drives a current source for each of the a-phase stator A, the b-phase stator B and a c-phase stator C. The power supply circuit 102 may be one of the many types of PMSM power supplies generally known to the art of PMSM motor design and may include, for example, a Pulse Width Modulation (PWM) inverter. Such a PWM inverter may employ a DC voltage source 104 and a plurality of controlled switches 106 to apply voltage vector at the appropriate times.

A shaft absolute position indicator 112, such as an encoder with an index pulse, is coupled to the shaft 110 and generates a position signal indicative of an absolute position of the shaft 110. As will be readily appreciated by those of skill in the art, the shaft position indicator 112 may be one of many other types of devices other than an encoder. The following types of devices are examples of devices that could be employed in the invention: resolver; linear Hall effect sensor; and a magneto-resistive device.

A current sensing circuit 114 generates a current signal indicative of instantaneous direct link current of the motor 108. The current sensing circuit could include, for example, a shunt. As will be readily appreciated by those of skill in the art, several other types of current sensing circuits could be employed within the scope of the invention. A sample and hold amplifier 116 samples the current signal when a trigger input is asserted. The trigger input signal is generated by a trigger generation algorithm 124. A processor 120 asserts the trigger input to the sample and hold amplifier 116 when the position signal from the shaft position indicator 112 indicates that the rotor is in a position where the internal back electromotive force for any phase is at either a maximum or a minimum, when the correct voltage vector is applied to the machine and when the dc link current pulse-width meets the minimum requirement. The processor 120 calculates torque generated by the motor 108 and flux current in the motor 108 based on the current signal value and decoding algorithm 122. As would be readily appreciated by those of skill in the art, the sample and hold function can be external to the processor 120 or the processor 120 could include an integrated Analog to Digital Converter (ADC) with sample/hold circuitry.

Figure 3:
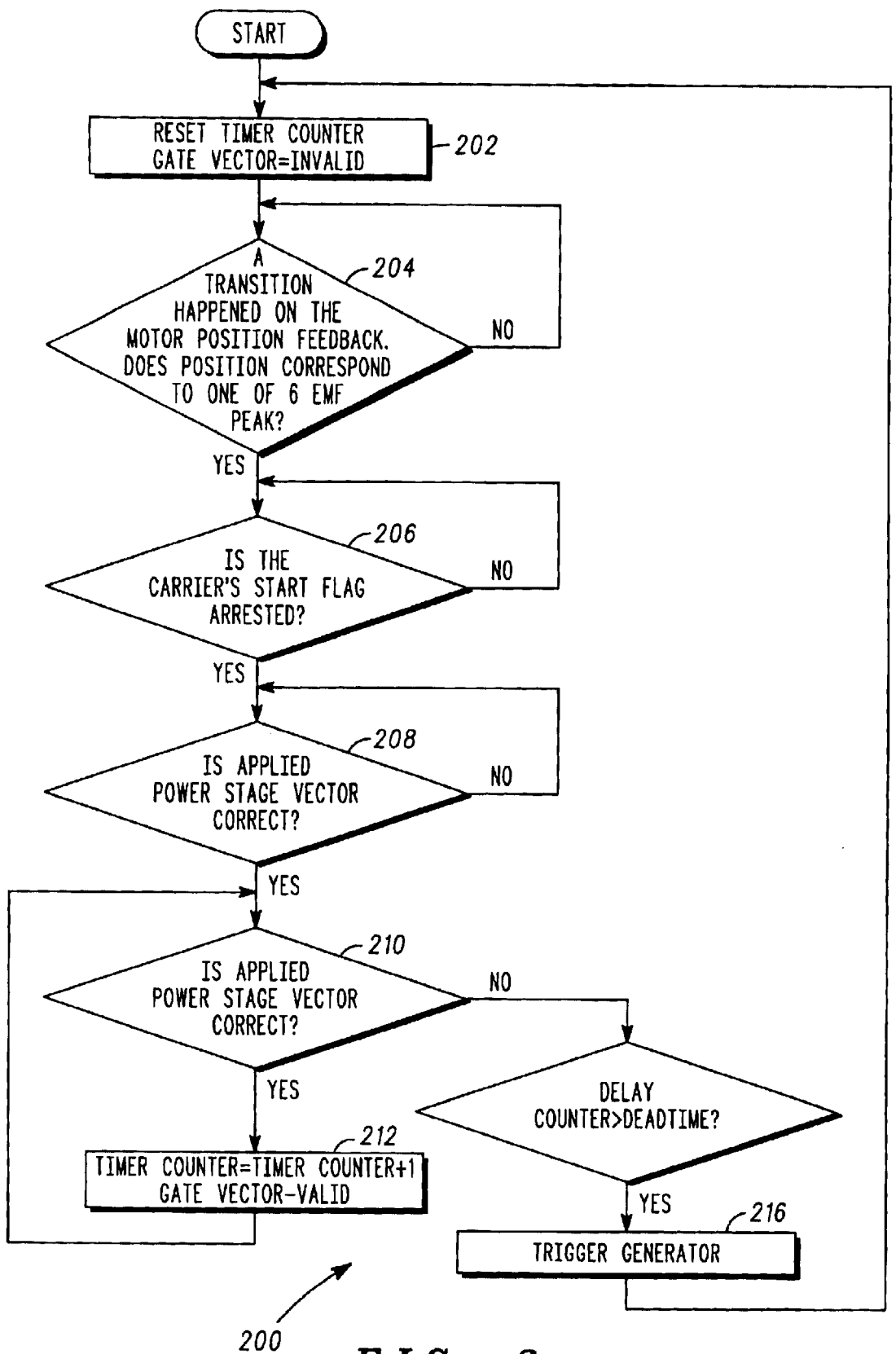
FIG. 3 is a flow chart illustrating one method of controlling a sample and hold circuit.

One illustrative example of a flowchart 200 for software used to program the processor 120 is shown in FIG. 3. The flowchart 200 applies only to an implementation with only one measurement channel and an $I_q$ measurement when the phase advance is less than 60 degrees. Initially, the system resets 202 a timer counter and initializes a Gate Vector flag to "invalid" state. The Gate Vector flag indicates the correct state where dc link current sampling is valid. Next, the system waits 204 until a transition is received from the encoder in which the indicated position corresponds to when the back EMF of the a-phase is at a maximum. (Another similar routine will wait for the back EMF to be a minimum. Also, this routine is repeated for the b-phase and c-phase.) The system then determines 206 if a carrier start flag is asserted and, if so, waits 208 until the applied voltage vector is correct. Decoding algorithm 121 as shown in FIG. 2 is used to determine the correct applied voltage vector. This test is repeated and if the conditions are the same, then the timer counter is incremented and the Gate Vector flag is set to 'valid' 212. The Gate Vector flag may also used to send a 'sample' trigger signal to enable Sample/Hold amplifier, but it does not 'hold' the signal yet. Once the state of the applied voltage vector changes, then the system tests whether the timer counter is greater than a minimum pulse-width 214. Diode reverse recovery current, dead time and hardware performance limitation determine the minimum pulse-width requirement. If the timer counter is less than the minimum pulse-width value, control passes to block 202, otherwise the trigger generation function will be executed 216 where the current signal must be acquired immediately, and then control returns to block 202. If an external Sample/Hold amplifier and a processor with built-in slow Analog to Digital Converter (ADC) are used in the system, the processor must send a 'hold' trigger signal to Sample/Hold amplifier to acquire and hold the dc link current signal. Then, a predetermined delay is introduced to allow signal settling and an interrupt is sent to the processor that causes the ADC to acquire the signal and converted it to a digital data. If an amplifier and a processor with built-in fast ADC are used in the system, the processor must immediately acquire the amplified dc link current and convert it to a digital data.

Thus, the method according to the invention samples six $I_{qs}$ and six $I_{ds}$ values over an electrical cycle. The error is limited to hardware performance. The apparatus does not need to sample DC link current at a high sample rate (around 200 Hz is generally enough) but it must be 'time accurate' because of short current pulse-width measurement (down to a few micro-seconds). While the disclosure here demonstrates the invention being applied to PMSM motors, it is understood that this technique also applies to any synchronous machine, including concentrated and sinusoidal distributed windings.

In practical implementation of this invention, it is important to know the minimum pulse width capability of the hardware. The algorithm must wait for the right rotor position and applied voltage vector configuration before generating a measurement trigger and it must also ensure that the corresponding current pulse is long enough to allow an accurate measurement. In addition, overshoot current in the DC link due to reverse diode recovery current must be blanked to avoid false reading. If the power stage transition times are longer than the measurement channel latency, the minimum pulse-width requirement must be adjusted accordingly to acquire the right current pulse.

Figure 1:
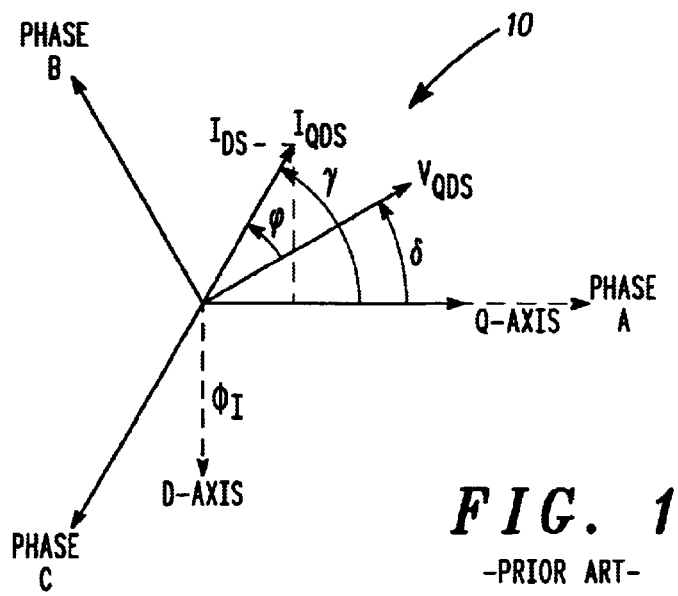
FIG. 1 is a graph showing typical space vectors representation of 3-phase PMSM operation.

As shown in FIG. 1, $I_{qs}$ is the current vector component of stator current $I_{qds}$ that is in phase and aligned with back EMF $E_f$ vector which is also set to align with reference q-axis. In other words, when the back EMF $E_f$ vector is at maximum, the corresponding $I_{qds}$ current vector is $I_{qs}$. $I_{ds}$ is the current vector component of stator current $I_{qds}$ that is in phase and aligned with d-axis. In positive speed rotation, $I_{qds}$, $V_{qds}$, $E_f$ vectors and reference d-q axis are also simultaneously rotating in a counter clockwise direction. When the rotor is in a position that corresponds to the maximum value of back EMF A-phase (Ea_max), it means the q-axis is aligned to A-phase which also means the EMF is aligned to stator phase current A-phase ($I_{as}$) Hence, the stator current A-phase $I_{as}$ at that instant corresponds to $I_{qs}$.

$I_{as}$ is the dc link current when the voltage vector applied to the motor is (1.0.0). Applied voltage vector (1.0.0) is a PWM inverter switching state that corresponds to high side switch (switch 106 of FIG. 2) of phase A and low side switches of phase B and C are closed.

θr is the rotor angle. The zero angle reference (θr=0) corresponds to the maximum back EMF between phase A and Neutral ($E_{a\_max}$) when the rotor is spinning at constant speed in a positive direction. The relationship between the rotor position θr and the backemf peaks is then the following:

|  | Rotor position θr | | | | | |
|---|---|---|---|---|---|---|
| Direction of rotation | 0° | 60° | 120° | 180° | 240° | 300° |
| Positive | Ea_max | Ec_min | Eb_max | Ea_min | Ec_max | Eb_min |
| Negative | Ea_min | Ec_max | Eb_min | Ea_max | Ec_min | Eb_max |

The measurement channel is triggered when 'rotor position=$E_{a\_max}$' and 'voltage vector=(1.0.0)', then $I_{dclink}$ current measurement will be equal to $I_{qs}$. The same scheme can be applied to all six rotor positions. The following table gives the relationship between the rotor position and the desired vector configuration:

TABLE 1

Decoding Algorithm to acquire torque current $I_{qs}$, valid for $-60° < \delta < +60°$

| Rotor Position θr at Negative Speed | Rotor Position θr at Positive Speed | BACK EMF Condition | $I_{qs}$ | $I_{qs}$ is $I_{dclink}$ sampled at applied voltage vector (AHI, BHI, CHI) |
|---|---|---|---|---|
| 180° | 0°   | $E_{a\_max}$ | $i_{as}$  | $I_{dclink}(100)$ |
| 0°   | 180° | $E_{a\_min}$ | $-i_{as}$ | $-I_{dclink}(011)$ |
| 300° | 120° | $E_{b\_max}$ | $i_{bs}$  | $I_{dclink}(010)$ |
| 120° | 300° | $E_{b\_min}$ | $-i_{bs}$ | $-I_{dclink}(101)$ |
| 60°  | 240° | $E_{c\_max}$ | $i_{cs}$  | $I_{dclink}(001)$ |
| 240° | 60°  | $E_{c\_min}$ | $-i_{cs}$ | $-I_{dclink}(110)$ |

$I_{qs}$ measurement, as shown in Table 1, is valid for all torque angle γ range if δ is within $-60°<\delta<+60°$, which can be ensured during the machine design. In this case, $I_{qs}$ can be measured with only one sampling of $i_{dclink}$. No further decoding is needed. $I_{qs}$ is always a positive value for $-90°<\gamma<+90$ indicating motoring operation. Otherwise $I_{qs}$ is a negative value indicating generating operation.

If δ is outside the −60° to +60° range, two samples of $i_{dclink}$ are needed to calculate $I_{qs}$. This method leads to slightly more involved decoding algorithm. The angle $\theta_e$ is the electrical angle fed to the PWM generator. The zero angle reference $\theta_e=0$) corresponds to a voltage vector (1.0.0) applied to the machine. Sectors I-VI are sector designators as shown in the following table, where the particular angle $\theta_e$ falls in:

TABLE 2

Sector definition of electrical angle

| Sector | Electrical Angle $\theta_e$ |
|---|---|
| I   | 0° ≦ $\theta_e$ < 60° |
| II  | 60° ≦ $\theta_e$ < 120° |
| III | 120° ≦ $\theta_e$ < 180° |
| IV  | 180° ≦ $\theta_e$ < 240° |
| V   | 240° ≦ $\theta_e$ < 300° |
| VI  | 300° ≦ $\theta_e$ < 0° |

The following table shows how to calculate $I_{qs}$ depending on the rotor position and applied voltage vector. It is valid for all range of torque angle γ and phase advance angle δ. Thus, the motor torque current $I_{qs}$=(sign of speed direction) *$I_Q$. The sign of speed direction is positive when the motor is rotating in forward direction.

TABLE 3

Decoding Algorithm to acquire torque current $I_{qs}$ $I_{qs}$ Decoding Algorithm

| Rotor Position θr | $I_Q$ | Sector I | Sector II | Sector III | Sector IV | Sector V | Sector VI |
|---|---|---|---|---|---|---|---|
| 0°   | $i_{as}$  | $I_{dclink}(100)$ | $-I_{dclink}(010)$ $+I_{dclink}(110)$ | $-I_{dclink}(011)$ | $-I_{dclink}(011)$ | $I_{dclink}(101)$ $-I_{dclink}(001)$ | $I_{dclink}(100)$ |
| 180° | $-i_{as}$ | $-I_{dclink}(100)$ | $I_{dclink}(010)$ $-I_{dclink}(110)$ | $I_{dclink}(011)$ | $I_{dclink}(011)$ | $-I_{dclink}(101)$ $+I_{dclink}(001)$ | $-I_{dclink}(100)$ |
| 120° | $i_{bs}$  | $-I_{dclink}(100)$ $+I_{dclink}(110)$ | $-I_{dclink}(010)$ | $I_{dclink}(010)$ | $I_{dclink}(011)$ $-I_{dclink}(001)$ | $-I_{dclink}(101)$ | $-I_{dclink}(101)$ |
| 300° | $-i_{bs}$ | $I_{dclink}(100)$ $-I_{dclink}(110)$ | $-I_{dclink}(010)$ | $-I_{dclink}(010)$ | $-I_{dclink}(011)$ $+I_{dclink}(001)$ | $I_{dclink}(101)$ | $I_{dclink}(101)$ |
| 240° | $i_{cs}$  | $-I_{dclink}(110)$ | $-I_{dclink}(110)$ | $I_{dclink}(011)$ $-I_{dclink}(010)$ | $I_{dclink}(001)$ | $I_{dclink}(001)$ | $-I_{dclink}(100)$ $+I_{dclink}(101)$ |
| 60°  | $-i_{cs}$ | $I_{dclink}(110)$ | $I_{dclink}(110)$ | $-I_{dclink}(011)$ $+I_{dclink}(010)$ | $I_{dclink}(001)$ | $-I_{dclink}(001)$ | $I_{dclink}(100)$ $-I_{dclink}(101)$ |

Similarly, two $I_{dclink}$ sampling are also needed to measure motor flux current $I_{ds}$. The same sector to vector relationship can be applied. The only difference comes from the rotor sampling position. The motor flux current $I_{ds}$=(sign of speed direction)*$I_D$. The sign of speed direction is positive when the motor is rotating in forward direction. The decoding algorithm is shown in the following table and is valid for all range of torque angle γ and phase advance angle δ:

TABLE 4

Decoding Algorithm to acquire flux current $I_{qs}$
$I_{ds}$ Decoding Algorithm

| Rotor Position θr | $I_Q$ | Sector I | Sector II | Sector III | Sector IV | Sector V | Sector VI |
|---|---|---|---|---|---|---|---|
| 270° | $i_{as}$ | $I_{dclink}(100)$ | $-I_{dclink}(010)$ +$I_{dclink}(110)$ | $-I_{dclink}(011)$ | $-I_{dclink}(011)$ | $I_{dclink}(101)$ $-I_{dclink}(001)$ | $I_{dclink}(100)$ |
| 90° | $-i_{as}$ | $-I_{dclink}(100)$ | $I_{dclink}(010)$ $-I_{dclink}(110)$ | $I_{dclink}(011)$ | $I_{dclink}(011)$ | $-I_{dclink}(101)$ +$I_{dclink}(001)$ | $-I_{dclink}(100)$ |
| 30° | $i_{bs}$ | $-I_{dclink}(100)$ +$I_{dclink}(110)$ | $-I_{dclink}(010)$ | $I_{dclink}(010)$ | $I_{dclink}(011)$ $-I_{dclink}(001)$ | $-I_{dclink}(101)$ | $-I_{dclink}(101)$ |
| 210° | $-i_{bs}$ | $I_{dclink}(100)$ $-I_{dclink}(110)$ | $-I_{dclink}(010)$ | $-I_{dclink}(010)$ | $-I_{dclink}(011)$ +$I_{dclink}(001)$ | $I_{dclink}(101)$ | $I_{dclink}(101)$ |
| 150° | $i_{cs}$ | $-I_{dclink}(110)$ | $-I_{dclink}(110)$ | $I_{dclink}(011)$ $-I_{dclink}(010)$ | $I_{dclink}(001)$ | $I_{dclink}(001)$ | $-I_{dclink}(100)$ +$I_{dclink}(101)$ |
| 330° | $-i_{cs}$ | $I_{dclink}(110)$ | $I_{dclink}(110)$ | $-I_{dclink}(011)$ +$I_{dclink}(010)$ | $-I_{dclink}(001)$ | $-I_{dclink}(001)$ | $I_{dclink}(100)$ $-I_{dclink}(101)$ |

The above described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. An apparatus for measuring torque and flux current in an AC synchronous drive motor having a shaft coupled to an a-phase, a b-phase and a c-phase, comprising:
   (a) an absolute shaft position indicator that is magnetically coupled to the shaft and that generates a position signal indicative of a position of the shaft;
   (b) a current sensing circuit that generates a current signal indicative of instantaneous direct link current of the motor;
   (c) a sample and hold amplifier that includes a trigger input and that samples the current signal, having a current signal value, when the trigger input is asserted; and
   (d) a processor, responsive to the position signal, that asserts the trigger input when the following events occur:
      i. the position signal indicates that each of the a-phase rotor, a b-phase rotor and a c-phase rotor is at a position where the internal back electromotive force for any phase is at either a maximum or a minimum;
      ii. when a voltage vector corresponding to a maximum or a minimum for a corresponding phase is applied to the motor; and
      iii. when the dc link current pulse-width meets a minimum requirement, the processor also responsive to the current signal so as to calculate torque generated by the motor and flux current in the motor based on the current signal value at a time when the trigger input is asserted.

2. The apparatus of claim 1, wherein the shaft position indicator comprises an encoder.

3. The apparatus of claim 2, wherein the encoder comprises an optical encoder.

4. The apparatus of claim 1, wherein the sample and hold amplifier generates an analog signal, the apparatus further comprising an analog-to-digital converter, responsive to the analog signal, that generates a digital signal that is proportional to the current signal, the digital signal being delivered to the processor.

5. A method of measuring torque and flux current in an AC synchronous drive motor having an a-phase stator winding, a b-phase stator winding and a c-phase stator winding, comprising the steps of:
   (a) sampling instantaneous direct link current of the motor when the rotor shaft is at a position where internal back electromotive force of each phase is at a maximum or at a minimum and a corresponding voltage vector is applied to the motor; and
   (b) calculating and decoding the torque and flux current in the motor based on the instantaneous direct link current of the motor when the rotor shaft is at a position where internal back electro-motive force of each phase is at a maximum and at a minimum and a correct voltage vector applied to the motor.

6. The method of claim 5, wherein the sampling step comprises the step of sensing the direct link current by sensing an output from a shunt.

7. The method of claim 6, wherein the motor includes a shaft that is coupled to the a-phase stator, the b-phase stator and the c-phase stator, and wherein the sampling step comprises the step of detecting the position of the shaft using an encoder that is coupled to the shaft.

8. The method of claim 7, wherein the sampling step further comprises the step of sensing the direct link current from the shunt using a sample and hold amplifier when the encoder indicates that any of the a-phase stator, the b-phase stator or the c-phase stator is at a position where internal back electromotive force of each phase is at either a maximum or a minimum and a corresponding voltage vector is applied to the motor.

9. The method of claim 8, further comprising the step of converting an output from the sample and hold amplifier from an analog value to a digital value.

* * * * *